(12) United States Patent
Liu

(10) Patent No.: US 6,787,734 B2
(45) Date of Patent: Sep. 7, 2004

(54) SYSTEM AND METHOD OF LASER DRILLING USING A CONTINUOUSLY OPTIMIZED DEPTH OF FOCUS

(75) Inventor: Xinbing Liu, Acton, MA (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 188 days.

(21) Appl. No.: 10/266,999

(22) Filed: Oct. 8, 2002

(65) Prior Publication Data

US 2004/0016730 A1 Jan. 29, 2004

Related U.S. Application Data

(60) Provisional application No. 60/398,469, filed on Jul. 25, 2002.

(51) Int. Cl.[7] .......................... B23K 26/38; B23K 26/06
(52) U.S. Cl. ............................. 219/121.7; 219/121.71
(58) Field of Search ..................... 219/121.7, 121.71, 219/121.82

(56) References Cited

U.S. PATENT DOCUMENTS

| | | | | |
|---|---|---|---|---|
| 4,608,480 A | * | 8/1986 | Bizot et al. | |
| 5,063,280 A | * | 11/1991 | Inagawa et al. | ......... 219/121.7 |
| 6,195,164 B1 | * | 2/2001 | Thompson et al. | |
| 6,256,883 B1 | * | 7/2001 | Kinoshita et al. | |

FOREIGN PATENT DOCUMENTS

| JP | 3-66488 A | * | 3/1991 |
|---|---|---|---|
| JP | 9-253877 A | * | 9/1997 |

* cited by examiner

*Primary Examiner*—Geoffrey S. Evans
(74) *Attorney, Agent, or Firm*—Harness, Dickey & Pierce, PLC

(57) ABSTRACT

A method of adjusting depth of focus in a laser milling system includes generating a laser beam having a focal plane, positioning a workpiece in the focal plane with a surface of the workpiece exposed to the laser beam at a point intersecting the focal plane, and adjusting a position of the workpiece or the focal plane to maintain a constant ablation rate on the exposed surface of the workpiece throughout the drilling process.

24 Claims, 4 Drawing Sheets

SYSTEM AND METHOD OF LASER DRILLING USING A CONTINUOUSLY OPTIMIZED DEPTH OF FOCUS

CROSS-REFERENCE TO RELATED APPLICATIONS

This application claims the benefit of U.S. Provisional Application Ser. No. 60/398,469 which was filed on Jul. 25, 2002 and is incorporated by reference herein.

FIELD OF THE INVENTION

The present invention generally relates to material ablation with pulsed light sources, and particularly relates to focus depth control in a laser milling system.

BACKGROUND OF THE INVENTION

Material ablation by pulsed light sources has been studied since the invention of the laser. Reports in 1982 of polymers having been etched by ultraviolet (UV) excimer laser radiation stimulated widespread investigations of the process for micromachining. Since then, scientific and industrial research in this field has proliferated—mostly spurred by the remarkably small features that can be drilled, milled, and replicated through the use of lasers.

Ultrafast lasers generate intense laser pulses with durations from roughly $10^{-11}$ seconds (10 picoseconds) to $10^{-14}$ seconds (10 femtoseconds). Short pulse lasers generate intense laser pulses with durations from roughly $10^{-10}$ seconds (100 picoseconds) to $10^{-11}$ seconds (10 picoseconds). A wide variety of potential applications for ultrafast and short pulse lasers in medicine, chemistry, and communications are being developed and implemented. These lasers are also a useful tool for milling or drilling holes in a wide range of materials. Hole sizes as small as a few microns, even sub-microns, can readily be drilled. High aspect ratio holes can be drilled in hard materials, such as cooling channels in turbine blades, nozzles in ink-jet printers, or via holes in printed circuit boards.

Ultrafast and short pulse laser systems can be designed to accommodate drilling and milling of thin materials (50 to 100 microns); however, there is a need in the field of laser micromachining to drill or mill a wider range of material thicknesses. Ablating thicker materials presents certain technological challenges, including maintaining control of the laser through the entire thickness of the material and providing a finished product that meets both customer specifications and established quality standards.

Several problems continue to exist in the field of material ablation with pulsed light sources, and one such problem relates to controlling the quality specifications of a laser-drilled final product. Recent advancements in the field of laser drilling have been effective in enhancing the quality (i.e., shape, contour, and repeatability) of finished products according to customer demands. However, a growing number of customers require an increased geometric complexity in their product designs. Using conventional industry techniques, it is difficult to meet the increasing quality market needs. What is needed is a way to control the quality specifications of a laser-drilled final product.

Another problem that persists in the field of material ablation with pulsed light sources relates to controlling laser drilling on a thick workpiece. In typical laser-drilling applications that work with thin materials, ablation need only be controlled through the range of a thin workpiece (such as 50 to 100 microns). However, as material thickness increases, ablation must be controlled through a wider range of thickness and through an increased number of ablation layers. As drilling is performed on thicker surfaces, maintaining laser parameters becomes increasingly more difficult. Therefore, greater control over the laser parameters that control ablation rates and hole shape geometry throughout the process becomes necessary. What is needed is a way to control laser drilling on a thick workpiece.

A further problem that continues to exist in the field of material ablation with pulsed light sources relates to maintaining a constant ablation rate on the surface of a thick workpiece throughout the drilling process. During ablation of a layer in laser drilling, a material void is created at the contact point on the workpiece surface, i.e., the point at which the laser spot size intersects with the material surface. Once a void in the material is created, the expected contact point is no longer the same in that location on the workpiece due to the removal of material. Because of the variations in laser beam intensity and spot size at the contact point, the ablation rate changes. What is needed is a way to maintain a constant ablation rate on the surface of a thick workpiece throughout the drilling process.

A still further problem that continues to exist in the field of material ablation with pulsed light sources relates to maintaining constant laser beam intensity and constant spot size on the surface of a thick workpiece throughout the drilling process. Laser beam spot size is measured at the point where the focused laser beam and the surface of the workpiece material intersect. At a known laser beam intensity and known spot size, the ablation rate can be calculated and thus predicted in order to meet customer specifications. In a thick workpiece, however, as layers of material are ablated away the workpiece surface is no longer in the focal plane of the laser drilling system. This means that the laser beam intensity and spot size are no longer the same as originally intended (at the point of ablation) and, thus, ablation control is decreased. A constant spot size is required to prevent hole geometry distortion and inconsistent geometrical shaping due to lack of ablation control. What is needed is a way to maintain constant laser beam intensity and constant spot size on the surface of a thick workpiece throughout the drilling process.

SUMMARY OF THE INVENTION

According to the present invention, a method of adjusting depth of focus in a laser milling system includes generating a laser beam having a focal plane, positioning a workpiece in the focal plane, wherein a surface of the workpiece is exposed to the laser beam at a point intersecting the focal plane, and adjusting a position of at least one of the workpiece and the focal plane, thereby maintaining a constant ablation rate on the exposed surface of the workpiece throughout the drilling process.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

The present invention provides a system for and a method of continuously optimizing the depth of focus of a laser drilling system using a moveable workpiece stage to provide consistent, controlled ablation throughout the milling process.

Figure 1:
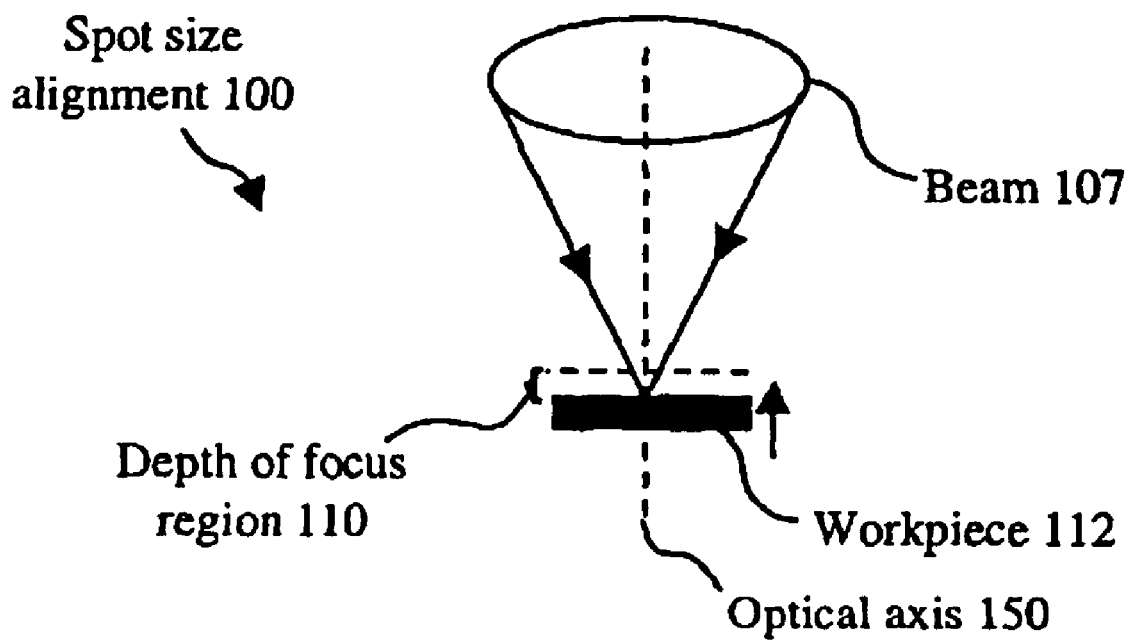
FIG. 1 is a perspective view of a spot size alignment within a laser drilling system.

Referring to FIG. 1, a perspective view of a spot size alignment 100 within a laser drilling system includes a workpiece 112, a beam 107, a depth of focus region 110, and an optical axis 150. Depth of focus region 110 is a region along optical axis 150 of beam 107 in which the spot size of beam 107 maintains a relatively constant radius that can be quantitatively determined.

Adjustments to the optical path of beam 107 or workpiece 112 along optical axis 150 of beam 107 may adjust depth of focus region 110 to an optimal point. The spot size of beam 107 is calculated to center the spot size of beam 107 within depth of focus region 110, thereby aligning beam 107 to the designated surface contact point on workpiece 112.

Figure 2:
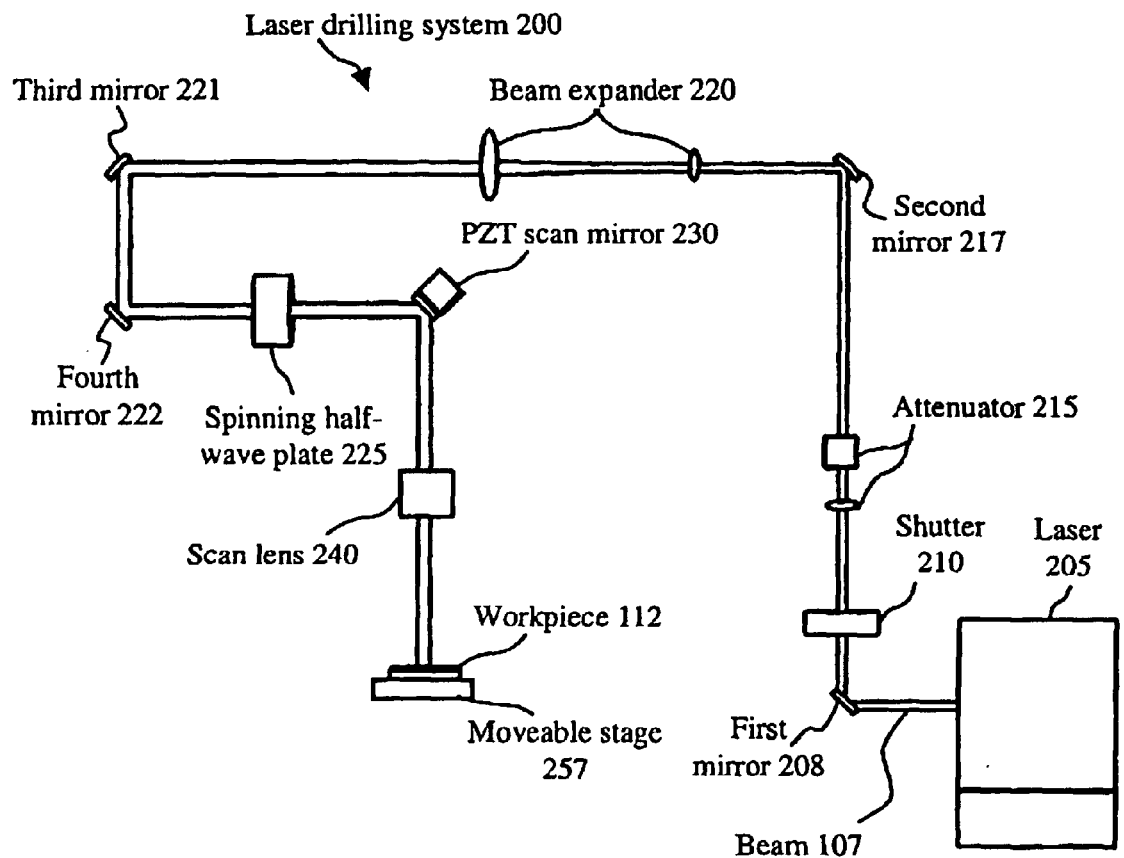
FIG. 2 is a simplified schematic of a laser drilling system.

FIG. 2 shows a simplified schematic of a laser drilling system 200, including a laser 205, a shutter 210, an attenuator 215, a beam expander 220, a spinning half-wave plate 225, a first mirror 208, a second mirror 217, a third mirror 221, a fourth mirror 222, a piezo electric transducer (PZT) scan mirror 230, a scan lens 240, and a moveable stage 257, arranged as shown. Although the present invention uses a picosecond laser system, the present invention may be generalized for use with other laser systems, such as excimer, $CO_2$, and copper vapor laser systems.

Although all elements of laser drilling system 200 are conventional, a brief description of the operation of laser drilling system 200 is provided below. In alternate embodiments, changes in the elements of laser drilling system 200 may be required. The present invention is not limited to the current selection and arrangement of elements in laser drilling system 200.

In operation, picosecond laser 205 emits beam 107 along the optical path identified in FIG. 2 above. Beam 107 propagates along the optical path, where it is incident upon first mirror 208. First mirror 208 redirects beam 107 along the optical path, where it is incident upon shutter 210. Shutter 210 opens and closes to selectively illuminate the workpiece material. Beam 107 exits shutter 210 and propagates along the optical path to attenuator 215. Attenuator 215 filters the energy of picosecond laser 205 in order to precisely control ablation parameters. Beam 107 exits attenuator 215 and propagates along the optical path, where it is incident upon second mirror 217. Second mirror 217 redirects beam 107 along the optical path, where it is incident upon beam expander 220.

Beam expander 220 increases the size of beam 107 to match the pupil size of scan lens 240. Beam 107 exits beam expander 220 and propagates along the optical path, where it is incident upon third mirror 221. Third mirror 221 redirects beam 107 along the optical path, where it is incident upon fourth mirror 222. Fourth mirror 222 redirects beam 107 along the optical path, where it is incident upon spinning half-wave plate 225. Spinning half-wave plate 225 changes the polarization of beam 107. Upon exiting spinning half-wave plate 225, beam 107 propagates along the optical path, where it is incident upon PZT scan mirror 230. PZT scan mirror 230 moves in a pre-defined pattern using a drilling algorithm (not shown) to drill the holes in workpiece 112. PZT scan mirror 230 redirects beam 107 along the optical path, where it is incident upon scan lens 240. Scan lens 240 determines the spot size of beam 107 upon workpiece 112. Beam 107 exits scan lens 240 and propagates along the optical path, where it is incident upon workpiece 112. Beam 107 ablates workpiece 112 in a pattern according to the pre-defined drilling algorithm. Moveable stage 257 is adjusted on a vertical axis to maintain accurate depth of focus and spot size of beam 107 on the contact surface of workpiece 112 during ablation. It is readily understood that to maintain accurate depth of focus, the scan lens 240 may also be adjustable along the vertical axis, such that the workpiece 112 remains in a fixed position.

FIGS. 3A–C show magnified views of depth of focus adjustments 300 made using moveable stage 257, and include a focal point 310 and an ablated region 312. Additional elements of laser drilling system 200 are shown in FIGS. 3A–C for the purpose of clarity.

As shown in FIG. 3A, scan lens 240 directs beam 107 to focal point 310 on the surface of workpiece 112 for material ablation. FIG. 3B illustrates how ablated region 312 is formed by beam 107, thereby causing focal point 310 to become displaced a distance equal to the depth of the ablated layer. The feed distance and direction of moveable stage 257 is identified in the present invention as $\Delta Z$.

FIG. 3C illustrates the adjustment made (shown as $\Delta Z$) to refocus beam 107 on the contact surface of workpiece 112. The distance that moveable stage 257 moves ($\Delta Z$) is predetermined based on the calculated ablation rate.

In operation, initial depth of focus settings are determined for focal point 310 of beam 107 on the contact surface of workpiece 112. As ablation region 312 is formed, a control unit (not shown) mechanically adjusts the feed distance $\Delta Z$ of moveable stage 257 to realign focal point 310 of beam 107 to the depth of the next layer to be ablated. This technique provides a continuous ablation of material within workpiece 112 while providing constant laser intensity to focal point 310 within selected depth of focus region 110.

Figure 3:
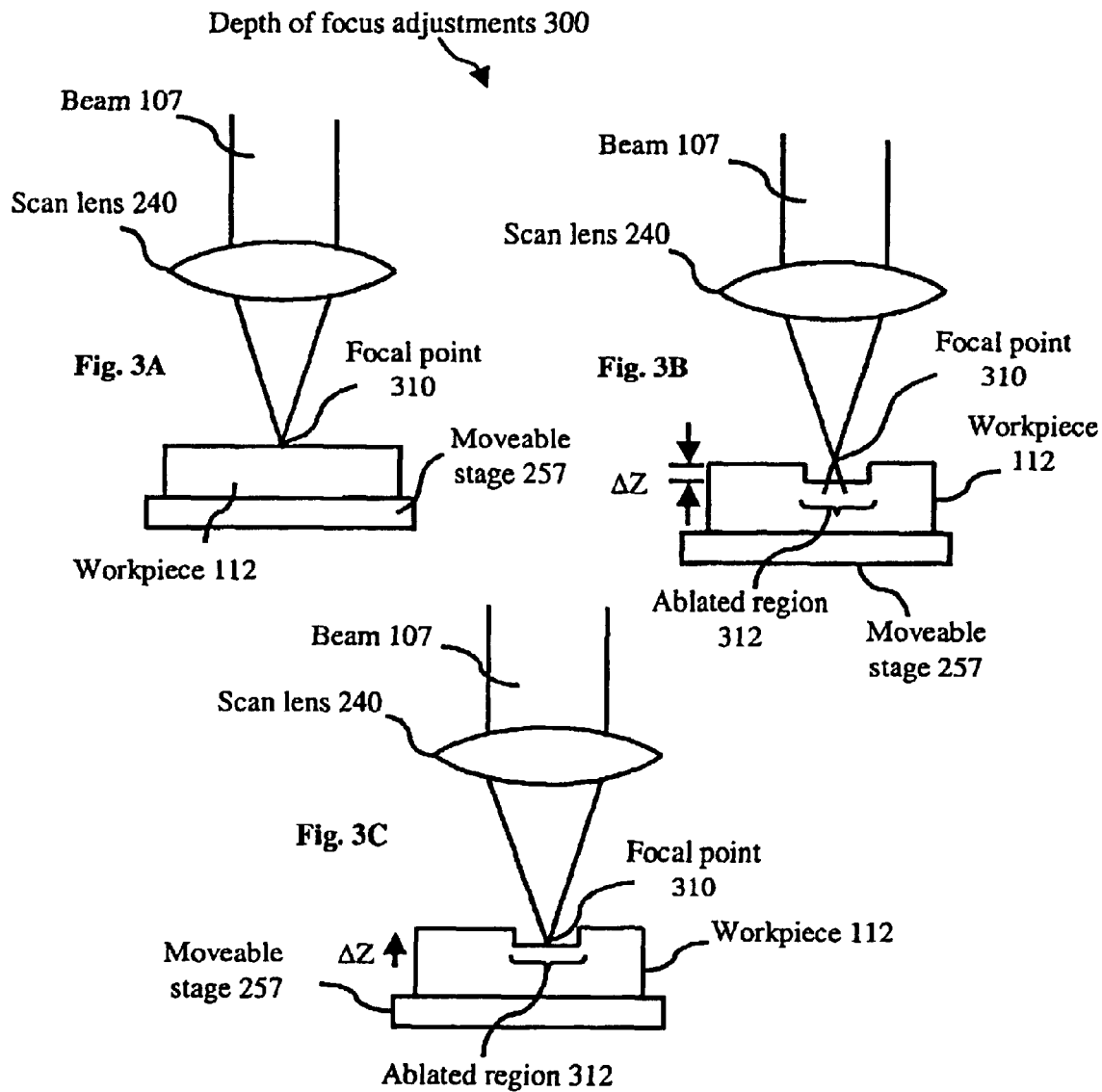
FIGS. 3A–C are magnified views of depth of focus adjustments made using a moveable stage.
Figure 4:
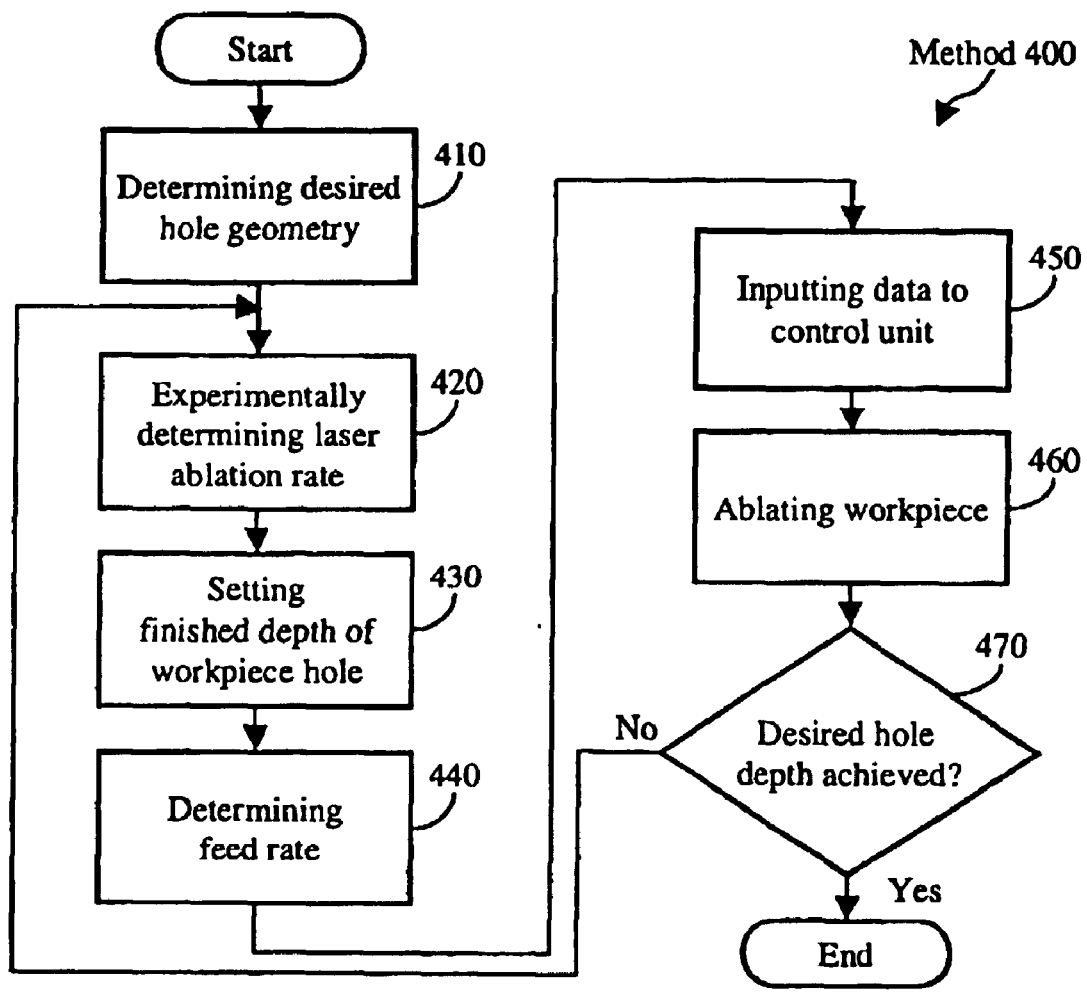
FIG. 4 is a flow chart diagram depicting a method of adjusting depth of focus in a laser drilling system.

FIG. 4 shows a method 400 of adjusting the depth of focus in laser drilling system 200, the steps of which are now described with reference to FIGS. 1–3.

At step 410, a desired hole geometry is determined. In this step, an operator or technician uses customer-specified information, such as CAD files, and technical notes to determine the desired hole geometry, including taper angle, exit hole diameter, and entrance hole diameter. In the present invention, the desired shape and dimensions are circular holes. However, this invention is not limited by a designated shape and may also be applied to the drilling of a general pattern geometry, such as lines, curves, squares, etc.

At step 420 a laser ablation rate is experimentally determined. In this step, an operator or technician determines the ablation rate (or material removal rate) with a given set of laser drilling parameters. Governing parameters of ablation rate include repetition rate, spot size, and laser power. Prior to milling workpiece 112, a number of trial milling runs are performed to measure and make adjustments to laser drilling system 200 to affect the ablation rate.

At step 430, a finished depth of the workpiece hole is set. In this step, an operator or technician determines the final desired hole depth of workpiece 112 using the material thickness of workpiece 112 and the desired hole shape as derived from step 410.

At step 440, a feed rate is determined. In this step, an operator, technician, or automated tool uses calculations derived from steps 410, 420, and 430 to determine the feed rate of moveable stage 257. The feed rate is equal to the determined ablation rate expressed in ablated depth per unit time for any particular drilling application. For example, if the ablation rate is determined to be 1 μm/sec for a particular material and size and shape for a given set of laser parameters, the feed rate will be 1 μm/sec.

At step 450, data is input to a control unit. In this step, an operator, technician, or automated tool inputs the data derived from steps 420, 430, and 440 into a control unit to enable adjustment of moveable stage 257.

At step 460, a workpiece is ablated. In this step, laser drilling system 200 adjusts depth of focus parameters to the surface of workpiece 112. Laser drilling system 200 then performs a milling algorithm to ablate material within workpiece 112. Ablation of workpiece 112 within entire ablated region 312 at pre-determined ablation depths, are based on the ablation rate as determined in step 420.

At step 470, a determination is made regarding whether a desired hole depth has been achieved. In this decision step, the milling algorithm determines whether the desired milled shape has been achieved. The milled shape is considered to be achieved when the milling algorithm has completed the pre-set number of ablation layers and moveable stage 257 has achieved a predetermined setpoint for the desired hole depth as determined in step 430. If yes, method 400 ends; if no, method 400 returns to step 420.

The present invention has several advantages. A first advantage of the present invention is that it provides a way to control the quality specifications of a laser-drilled final product. A second advantage of the present invention is that it provides a way to control laser drilling on a thick workpiece. A third advantage of the present invention is that it provides a way to maintain a constant ablation rate on the surface of a thick workpiece throughout the drilling process. A fourth advantage of the present invention is that it provides a way to maintain constant laser beam intensity and constant spot size on the surface of a thick workpiece throughout the drilling process. A fifth advantage of the present invention is that it provides a way to make adjustments to the depth of focus using only one moveable element. A sixth advantage of the present invention is that it allows simplified patterns to be made without taking into account material thickness.

The present invention also has some disadvantages. One disadvantage of the present invention is that if the feed rate of the moveable stage is too slow, then it may be difficult for the invention to maintain a consistent geometric hole shape. However, further advances in tooling hardware, software, and microcontrolling devices in the field of micromachining may soon alleviate this area of concern.

There also exists another way to solve the same problem (s) addressed by the invention. One other way to solve the same problem is to adjust the depth of focus of the laser drilling system by manually adjusting individual laser system elements (such as the scan lens). However, this technique is time consuming and cumbersome, and could introduce optical alignment problems in the laser drilling system.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A depth of focus control system for use with a laser drilling system, comprising:

a laser beam having a focal plane;

a workpiece, wherein a surface of the workpiece is exposed to the laser beam at a point intersecting the focal plane; and a control module operable to adjust position of said workpiece as a function of ablation rate of material of said workpiece respective of said laser beam, thereby maintaining a constant ablation rate on the exposed surface of said workpiece throughout the drilling process.

2. The system of claim 1 comprising a moveable stage operable to support the workpiece, wherein said control module is operable to adjust a position of said moveable stage.

3. The system of claim 2, wherein said control module is operable to adjust the position of said moveable stage as a function of ablation rate of material of said workpiece respective of said laser beam.

4. The system of claim 2, wherein said control module is operable to adjust the position of said moveable stage as a function of shape formed in said workpiece as a result of the drilling process.

5. The system of claim 2, wherein said control module is operable to adjust the position of said moveable stage as a function of a tool path employed to foam a shape in said workpiece during the drilling process.

6. The system of claim 2, wherein said control module is operable to adjust the position of said moveable stage as a function of an algorithm employing a tool path to form a shape in said workpiece during the drilling process.

7. The system of claim 2, wherein said control module is operable to adjust the position of said moveable stage as a function of:

an ablation rate of material of said workpiece respective of said laser beam;

a shape formed in said workpiece as a result of the drilling process;

a tool path employed to form said shape in said workpiece during the drilling process; and an algorithm employing said tool path to form said shape in said workpiece during the drilling process.

8. The system of claim 7, wherein the tool path is based on an analyzed, desired hole geometry.

9. The system of claim 1, wherein said control module is operable to adjust the position of said workpiece as a function of:

a shape formed in said workpiece as a result of the drilling process.

10. The system of claim 9, wherein said control module is operable to adjust the position of said workpiece as a function of:

a tool path forming said shape in said workpiece during the drilling process; and an algorithm employing said tool path to form said shape in said workpiece during the drilling process.

11. The system of claim 1 comprising a moveable scan lens adapted to focus the laser beam on the surface of the workpiece, wherein said control module is operable to adjust a position of the scan lens.

12. The method of claim 11 wherein the workpiece is further defined as a nozzle plate of an ink-let head.

13. The method of claim 1 wherein the workpiece is further defined as a nozzle plate of an ink-jet head.

14. A method of adjusting depth of focus in a laser drilling system, comprising:

generating a laser beam having a focal plane;

positioning a workpiece in the focal plane, wherein a surface of the workpiece is exposed to the laser beam at a point intersecting the focal plane; and adjusting a position of the workpiece as a function of ablation rate of material of said workpiece respective of said laser beam, thereby maintaining a constant ablation rate on the exposed surface of the workpiece throughout the drilling process.

15. The method of claim 14 comprising adjusting a position of a moveable stage supporting the workpiece.

16. The method of claim 15 comprising adjusting the position of the moveable stage as a function of a tool path employed to form a shape in said workpiece during the drilling process.

17. The method of claim 15 comprising adjusting the position of the moveable stage as a function of an algorithm employing a tool path to form a shape in said workpiece during the drilling process.

18. The method of claim 15 wherein said control module is operable to adjust the position of said moveable stage as a function of:

an ablation rate of material of said workpiece respective of said laser beam;

a shape formed in said workpiece as a result of the drilling process;

a tool path employed to form said shape in said workpiece during the drilling process; and an algorithm employing said tool path to form said shape in said workpiece during the drilling process.

19. The method of claim 18 wherein the tool path is based on an analyzed, desired hole geometry.

20. The method of claim 15 comprising adjusting the position of the moveable stage as a function of ablation rate of material of the workpiece respective of the laser beam.

21. The method of claim 15 comprising adjusting the position of the moveable stage as a function of a shape formed in the workpiece as a result of the drilling process.

22. The method of claim 14 further comprises passing the laser beam through a scan lens to form the focal plane and adjusting the position of the focal plane by moving the scan lens.

23. The method of claim 14 comprising adjusting the position of said workpiece a function of:

a shape formed in said workpiece as a result of the drilling process.

24. The method of claim 23 comprising adjusting the position of said workpiece as a function of:

a tool path forming said shape in said workpiece during the drilling process; and an algorithm employing said tool path to form said shape in said workpiece during the drilling process.

* * * * *